US012136558B2

(12) United States Patent
Patel et al.

(10) Patent No.: US 12,136,558 B2
(45) Date of Patent: Nov. 5, 2024

(54) GENERATING EDGE ADJUSTED DROP PATTERNS

(71) Applicant: CANON KABUSHIKI KAISHA, Tokyo (JP)

(72) Inventors: Mehul N. Patel, Austin, TX (US); Ahmed M. Hussein, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 106 days.

(21) Appl. No.: 17/855,564

(22) Filed: Jun. 30, 2022

(65) Prior Publication Data

US 2024/0006209 A1 Jan. 4, 2024

(51) Int. Cl.

*H01L 21/67* (2006.01)
*G03F 7/00* (2006.01)
*H01L 21/66* (2006.01)

(52) U.S. Cl.

CPC ...... *H01L 21/67288* (2013.01); *G03F 7/0002* (2013.01); *H01L 22/12* (2013.01)

(58) Field of Classification Search

None

See application file for complete search history.

(56) References Cited

U.S. PATENT DOCUMENTS 8,586,126 B2 11/2013 Schumaker
2011/0031650 A1 2/2011 Mcmackin et al.
2018/0162014 A1 6/2018 Fletcher et al.
2018/0164678 A1 6/2018 Fletcher et al.
2018/0166349 A1 6/2018 Fletcher et al.
2019/0139789 A1 5/2019 Tavakkoli Kermani Ghariehali et al.
2020/0201190 A1* 6/2020 Bean .................. G03F 7/70625
2022/0091500 A1 3/2022 Tavakkoli Kermani Ghariehali et al.

FOREIGN PATENT DOCUMENTS

WO WO-2010047766 A1 * 4/2010 ............ B82Y 10/00

* cited by examiner

*Primary Examiner* — Robert J Grun
(74) *Attorney, Agent, or Firm* — CANON U.S.A., INC. IP DIVISION

(57) ABSTRACT

A base drop pattern (BDP) is generated based on at least one of input parameters. A segment required compensation volume (RCV) of edge segments near edges of the imprint field is estimated. Edge drop arrangements at the edge segments are generated based on the estimated segment RCV and a guide command from a user.

26 Claims, 10 Drawing Sheets

GENERATING EDGE ADJUSTED DROP PATTERNS

BACKGROUND

Technical Field

One disclosed aspect of the embodiments relates to semiconductor fabrication applications. In particular, one disclosed aspect of the embodiments relates to techniques to generate edge adjusted drop patterns.

Description of the Related Art

Nanoimprint lithography (NL) has become an important technology in semiconductor manufacturing. NL offers many promising advantages over other technologies such as photolithography and extreme ultraviolet (EUV) lithography.

In a typical fabrication of semiconductor devices using NL, a fluid dispense system deposits a formable material such as a resist onto a wafer using a fluid droplet dispenser. The formable material is patterned into a patterned layer on the wafer by a template. This pattern is referred to as a drop pattern. Depending on the substrate topology and template design, the pattern of the drop pattern may vary.

One typical problem in the fabrication process is the presence of extrusions and non-filled marks.

SUMMARY

A base drop pattern (BDP) is generated based on at least one of input parameters. A segment required compensation volume (RCV) of edge segments near edges of the imprint field is estimated. Edge drop arrangements at the edge segments are generated based on the estimated segment RCV and a guide command from a user.

Further features of the disclosure will become apparent from the following description of exemplary embodiments with reference to the attached drawings.

DESCRIPTION OF THE EMBODIMENTS

One disclosed aspect of the embodiments includes a technique to generate drop patterns used in nanolithography imprinting. A system includes a wafer holder to hold one or more test wafers, each having an imprint field. A generator generates a set of test drop patterns includes a storage device, an input/output (I/O) interface circuit, a processor, and a memory storing instructions that, when executed by the processor, cause the processor to perform operations in the generation of drop patterns. The storage device stores a database that contains input parameters of a drop pattern generation (DPG) process for a template. The I/O interface circuit interfaces with a user. The operations include receiving a guide command from the user via the I/O interface circuit to guide the DPG process, retrieving the input parameters from the database, generating a base drop pattern (BDP) based on at least one of the input parameters, estimating a segment required compensation volume (RCV) of edge segments near edges of the imprint field, generating edge drop arrangements at the edge segments based on the estimated segment RCV and the guide command, generating mark drop arrangements, and generating a drop pattern as one of the drop patterns in the set. The set of drop patterns is deposited onto the one or more test wafers to determine an optimal drop pattern.

Figure 1:
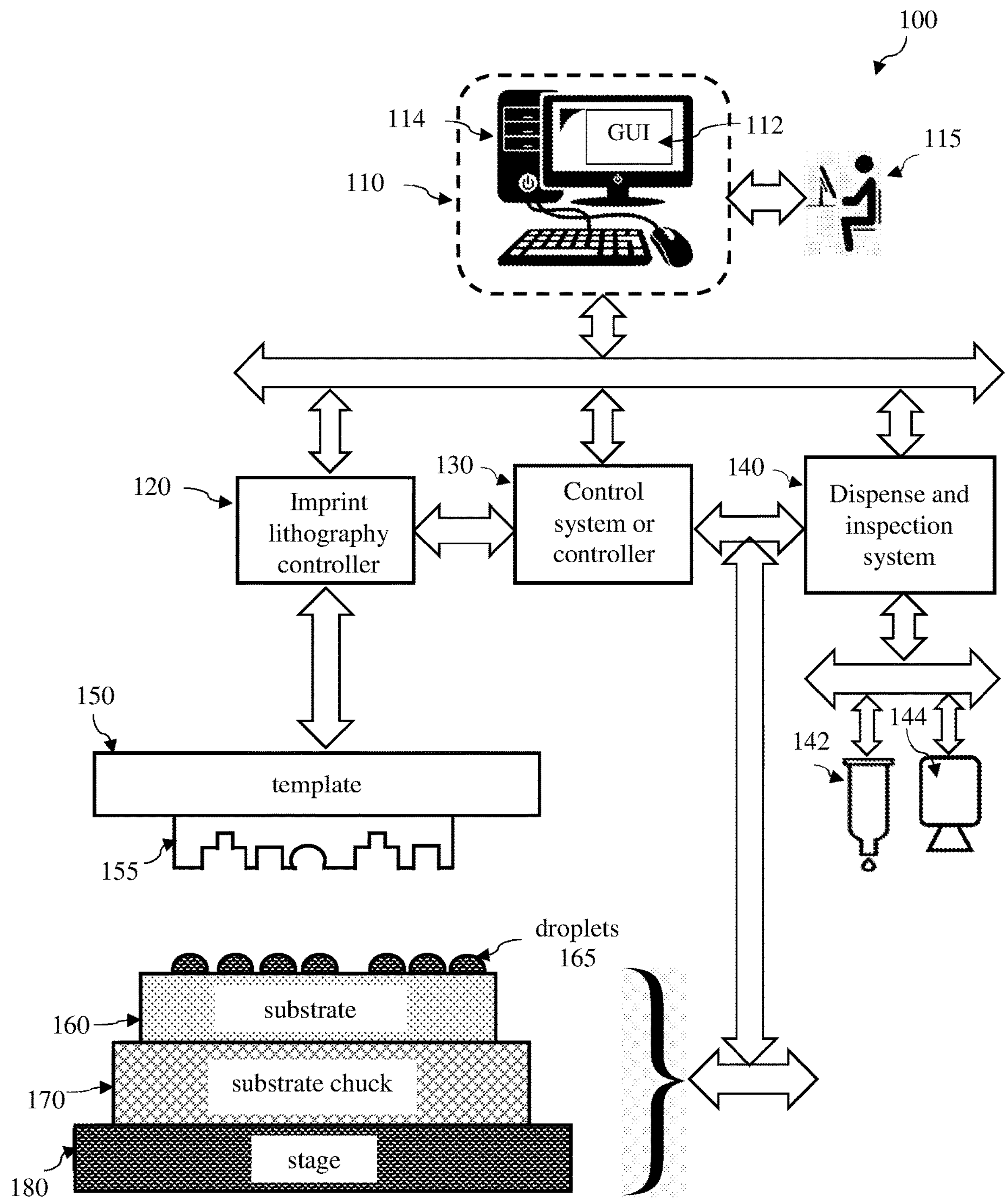
FIG. 1 is a diagram illustrating a system for nano-imprint lithography.

FIG. 1 is a diagram illustrating a system 100 for nano-imprint lithography. The system 100 includes a processing system 110, an imprint lithography controller 120, a control system or controller 130, and dispense and inspection system 140, a template 150 having a template pattern 155, a substrate 160, a substrate chuck 170, and a stage 180. The system 100 may include more or less than the above components. The system 100 is configured to generate drop patterns for use in lithography imprinting.

The processing system 110 provides processing and control functions for the lithography imprinting process. It includes a storage device 114 and a graphical user interface (GUI) 112. A user 115 interacts with the processing system to provides user commands to guide the process of generating the drop patterns. The storage device 114 may be any suitable non-volatile storage such as optical drive, hard disk drive, or solid-state drive. It typical stores a database that contains input parameters of a drop pattern generation (DPG) process for a template.

The imprint lithography controller 120 controls the positioning and movement of the template 150. It may include an energy source and an imprint head (not shown) which helps in the movement of the template 150, and associated control circuits. It may also be controlled by the processing system 110 or the controller/control system 130.

The template 150 may be made from a material such as synthetic quartz, fused silica, silicon, organic polymers, or other suitable materials. The template pattern 155 includes features that have recesses and protrusions corresponding to the pattern to be formed on the substrate 160.

The substrate 160 may be coated with a thin adhesion layer to help in the adhesion to the resist after curing. It may be held by the substrate chuck 170 and both are positioned on the stage 180. The stage 180 may be controlled by the control system 130 to move the substrate and substrate chuck assembly.

The dispense and inspection system 140 is configured to dispense liquid resist into droplets 165 on the substrate 160. The processing system 110 or the controller or control system 130 provides user interface to a user and performs various control functions to other components in the system 100.

Figure 2:
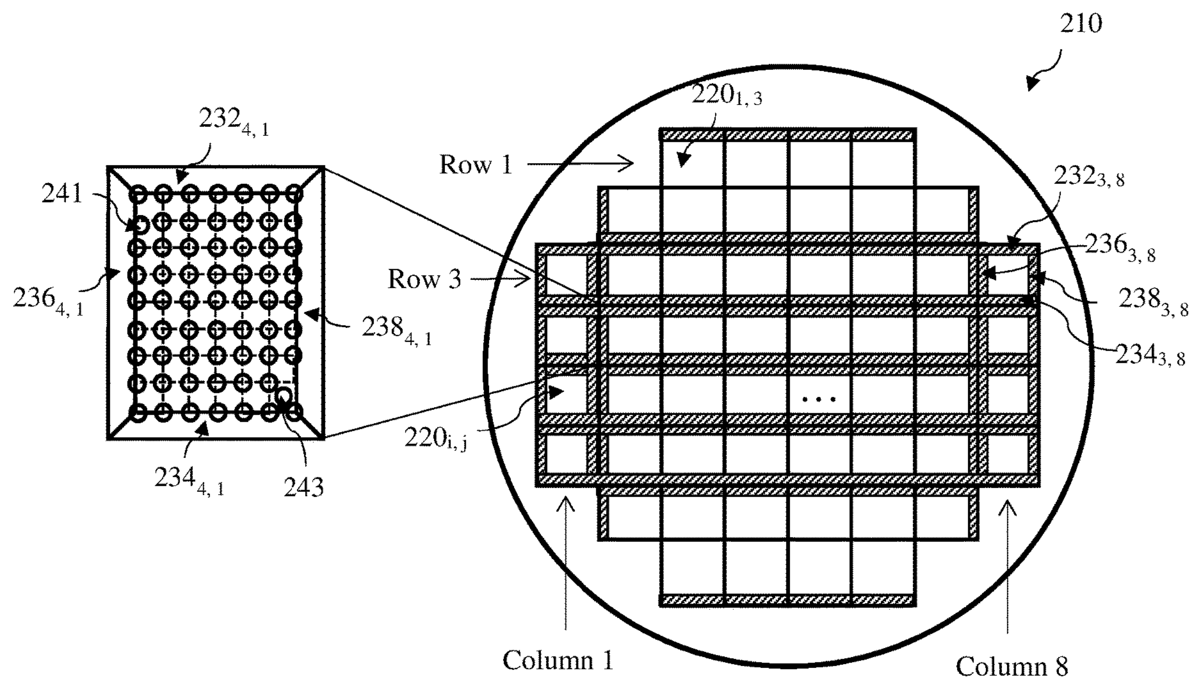
FIG. 2 is a diagram illustrating a wafer having imprint fields.

FIG. 2 is a diagram illustrating a wafer 210 having imprint fields. The wafer 210 includes a plurality of imprintable fields $\mathbf{220}_{i,j}$'s organized as a two-dimensional arrays. A typical wafer has a circular shape. The imprintable fields therefore are organized within the circular limit of the wafer. The plurality of imprintable fields may include an array of full imprintable fields as shown in FIG. 2, along with a plurality of partial fields (not illustrated) that intersect with the imprint field edges. For ease of reference, an imprintable field is indexed by the coordinates indicated by the indices (i,j) where i refers to the row number and j refers to the column number. For the example shown in FIG. 2, the row number starts from 1 from the top and the column number starts from 1 from the leftmost. Therefore, the upper left field is referred to as $\mathbf{220}_{1,3}$ because it is at row 1 and column 3. The imprintable fields receive the drops from the dispenser 142. The drops form a drop pattern. The drops near the edges (horizontal and vertical) of each field are susceptible to defects such as extrusions and non-filling. In addition, marks, such as alignment marks, near the edges are also susceptible to non-filled defects. Marks are large scale features (on the order of 3-150 microns) which may be used for alignment as opposed to the small-scale features (1-500 nm) that are found throughout the template and are used to pattern the formable material that are used to form device features on the substrate. Marks of interest are typically found near the edges of a template but in an alternative embodiment, they may be elsewhere on the template.

The regions around the edges of each field are shown in cross-hatched or shaded. For ease of reference, the upper horizontal edge region is labeled $\mathbf{232}_{i,j}$, the lower horizontal edge region is labeled $\mathbf{234}_{i,j}$, the left vertical edge region is labeled $\mathbf{236}_{i,j}$, and the right vertical edge region is labeled $\mathbf{238}_{i,j}$. In an embodiment, the edge regions for a field may overlap each other at the corners of the fields. Each field has a grid of equally spaced horizontal and vertical lines which are used for locating and referencing. The drops are typically positioned on the grids. When a drop position is located far from the grid, such as the positions 241 and 243 shown in FIG. 2, it is usually snapped to the nearest grid line. The grid may be determined by the limitations of the dispensing system.

As shown in FIG. 2, the edge regions around the field $\mathbf{220}_{4,1}$ includes the horizontal regions $\mathbf{232}_{4,1}$ and $\mathbf{234}_{4,1}$ and the vertical regions $\mathbf{236}_{4,1}$ and $\mathbf{238}_{4,1}$. These are the regions that the technique in this disclosure mainly is focused on, namely, the generation of patterns for drops near the edges.

Figure 3:
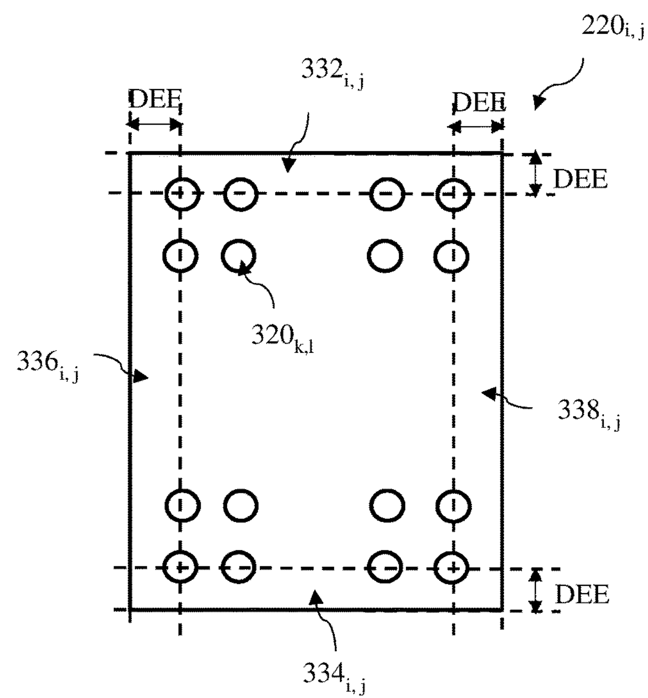
FIG. 3 is a diagram illustrating a drop edge exclusion (DEE).

FIG. 3 is a diagram illustrating a drop edge exclusion (DEE) for the field $\mathbf{220}_{i,j}$. The field $\mathbf{220}_{i,j}$ has a number of drop positions $\mathbf{320}_{k,l}$'s arranged in a two-dimensional pattern. The distances from the centers of the drops $\mathbf{320}_{k,l}$'s to the edges are typically constant because the drops $\mathbf{320}_{k,l}$'s are fairly aligned. This constant distance defines the DEEs which enclose a region where the drops are not allowed to occupy due to the increasing susceptibility to defects. Since there are rows and columns of the drops and there are horizontal and vertical edges, the DEE defines four distances. The DEEs will be dependent on the selected BDP. Therefore there are four DEEs: $\mathbf{232}_{i,j}$ for the upper horizontal edge, $\mathbf{234}_{i,j}$ for the lower horizontal edge, $\mathbf{236}_{i,j}$ for the left vertical edge, and $\mathbf{238}_{i,j}$ for the right vertical edge.

Figure 4:
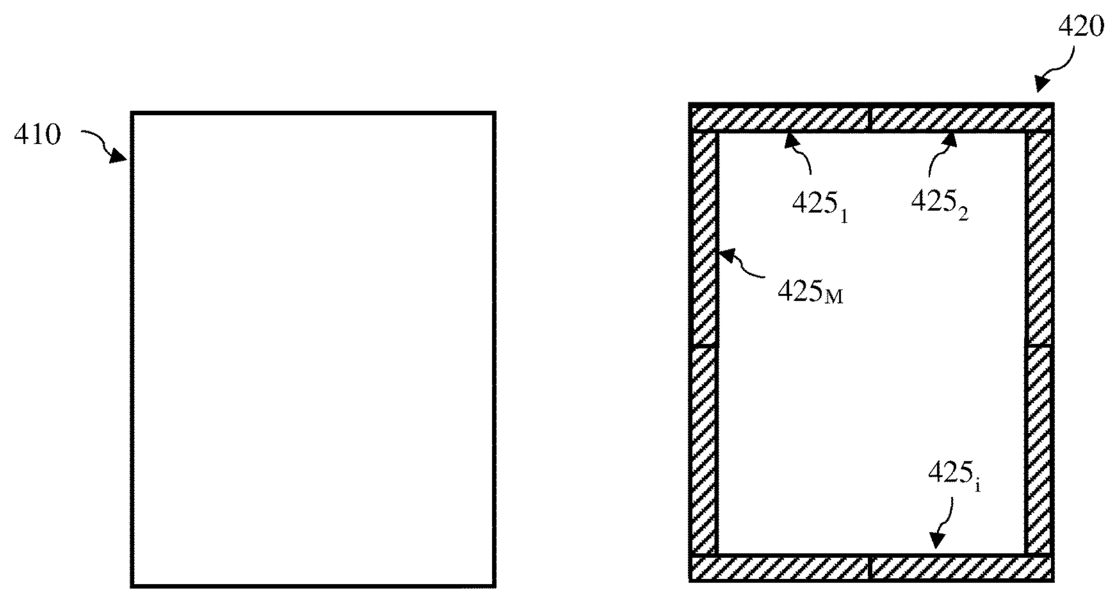
FIG. 4 is a diagram illustrating edge segments in a rectangular field.

FIG. 4 is a diagram illustrating edge segments in a rectangular field. The process to generate the drop patterns for drops near the edges proceeds on a basis of segments or local regions. For templates with non-straight imprint field edges (e.g. jigsaw edges), the edge needs to be broken into multiple segments that have substantially straight edges adjacent to the base grid pattern. In addition, the partitioning of the regions near the edges into segments has a number of advantages. First, it allows the process to maintain properties that are typically locally valid, such as feature height, nearby feature density, etc. Second, by confining the process within small segments, the process tends to reduce large variations in the physical attributes such as volume and height. Third, from the computational point of view, working on the basis of segments may be efficient for parallel computations, especially for multi-core or multi-threaded architectures.

The field 410 is a rectangular field. The segmentation is therefore straightforward, including the partitioning along the vertical and horizontal edges. The segments form a continuous chain running around the periphery of the field 410. The segmented field 420 includes several segments as shown from $\mathbf{425}_1$, $\mathbf{425}_2$ to $\mathbf{425}_M$. The exact length of each segment is determined in advance based on experiments.

Figure 5:
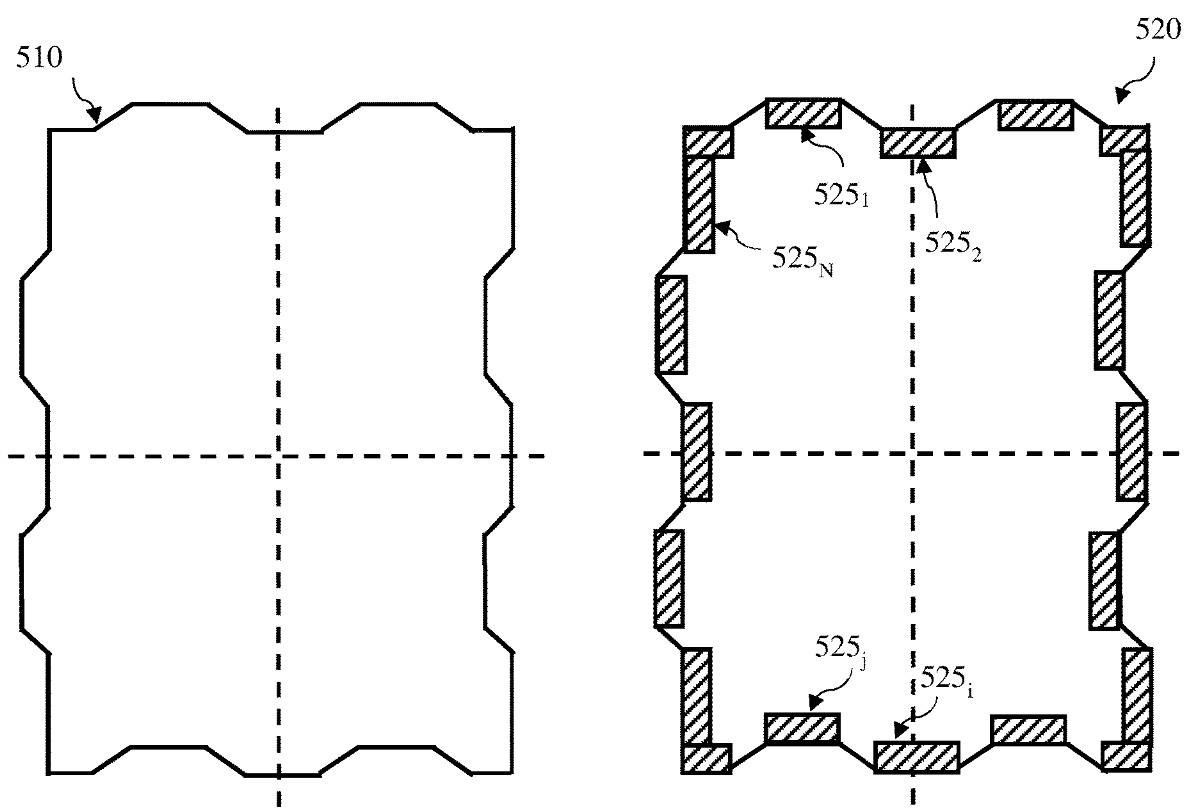
FIG. 5 is a diagram illustrating edge segments in an arbitrary shaped field.

FIG. 5 is a diagram illustrating edge segments in an arbitrary shaped field. The field 510 may have an irregular shape, or a jig-saw shape. The segmented field 520 includes a number of segments, from $\mathbf{525}_1$ to $\mathbf{525}_N$, located around the periphery at discontinuities. The discontinuities are often at the positions where there are no drops because of the difficulties in maintaining a regular or even intervals. These often occur at the diagonal lines at the periphery.

Figure 6:
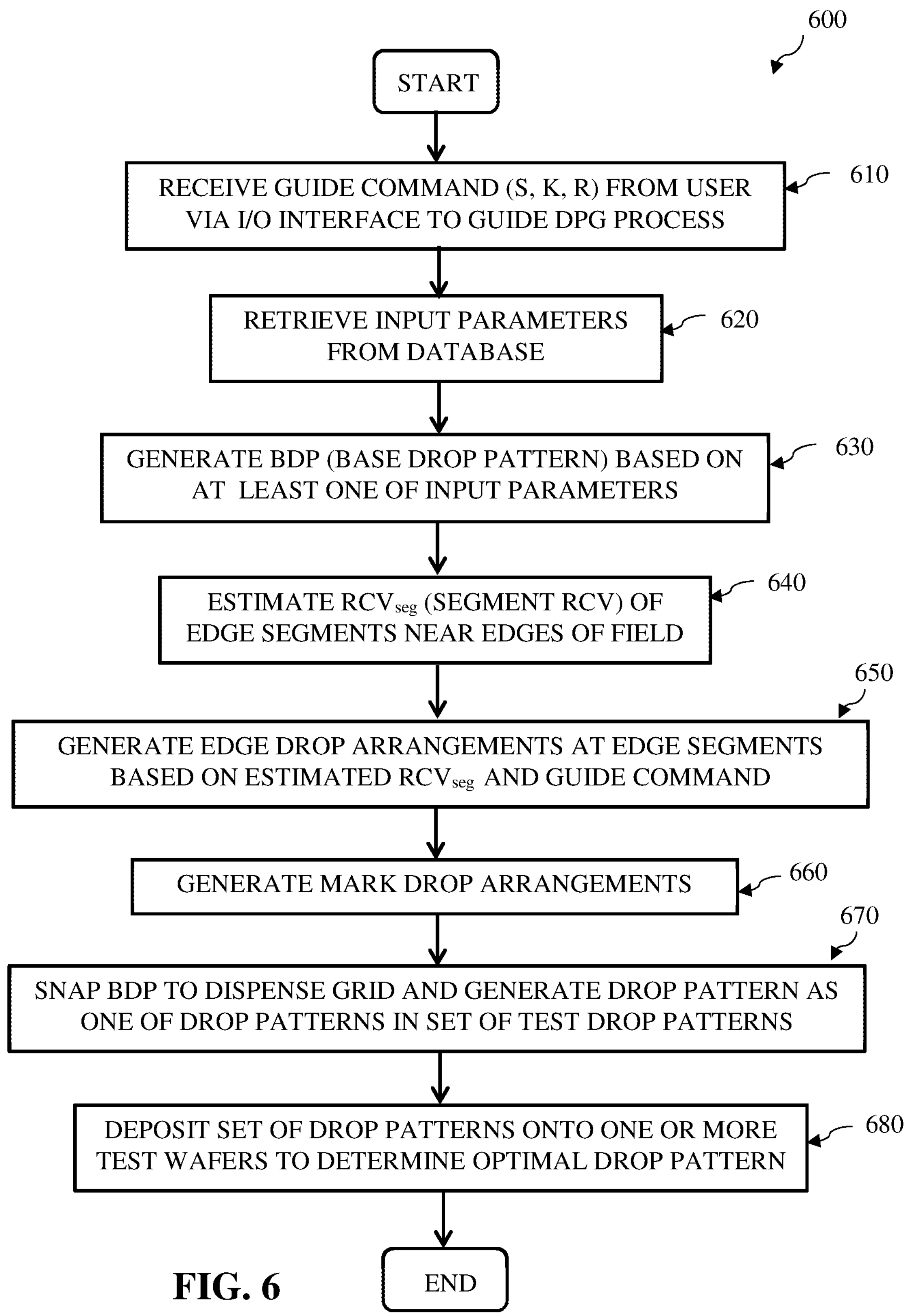
FIG. 6 is a diagram illustrating a process to generate edge adjusted drop patterns.

FIG. 6 is a diagram illustrating a process 600 to generate edge adjusted drop patterns. The process 600 is the overall process and may be performed at the processing system 110 or the controller 130. The process 600 includes operations or steps that are performed by the processor in the respective system.

Upon START, the process 600 receives a guide command from the user via the I/O interface circuit to guide the DPG process (Block 610). The guide command may include a command to carry out a task, or a guiding parameter to guide the process. The user 115 enters the guide command via the GUI 112. In one embodiment, the guide command includes one of a compensation factor S, a template factor K, and a distance factor R. The significance of these factors will be discussed later. Next, the process 600 retrieves at least one of the input parameters from the database stored on the storage device 114. The input parameters may include at least one of a set of template attributes, a desired Residual Layer Thickness (RLT), a drop volume, a minimum dispensing pitch, and a set of wafer attributes. Then, the process 600 generates a base drop pattern (BDP) based on at least one of the input parameters (Block 630). The BDP may be any suitable pattern such as a grid drop pattern (GDP). Another possible pattern is a pattern with drop locations substantially aligned with the features such as those calculated by the power centroidal Voronoi tessellation (PCVT). The BDP is the initial drop pattern to allow the process to get started, the BDP will be modified and updated throughout the process and will eventually become a final BDP at the end of the process.

One property of a BDP is the BDP period which is the shortest distance over which the drop arrangement of the BDP repeats. This is the same for all segments along the left/right and top/bottom edges. A GDP will have a natural period because the drops are positioned on a grid. For a non-grid drop pattern this may be generalized to an approximate BDP period that is based on an underlying periodicity of the features being filled or may be a period that is the same size as the imprint field.

Next, the process 600 estimates a segment required compensation volume (RCV) of edge segments near edges of the imprint field (Block 640). The RCV is the total fluid volume required to bring the thickness near the edge segment close to the target RLT. The RCV calculation takes into account template and/or wafer features that exist near the edge. Then, the process 600 generates edge drop arrangements at the edge segments based on the estimated segment $RCV_{seg}$ and the guide command (Block 650). Next, the process 600 generates a mark drop arrangement different from the drop pattern at a segment where a mark is formed (Block 660). Then, the process 600 snaps the GDP to the dispense grid and generates a drop pattern based on the BDP and the edge drop arrangements as one of the drop patterns in the set (Block 670). Each drop pattern in the set has different edge arrangements. The set of drop patterns is deposited onto the one or more test wafers to determine an optimal drop pattern (Block 680). The process 600 is then terminated.

Figure 7:
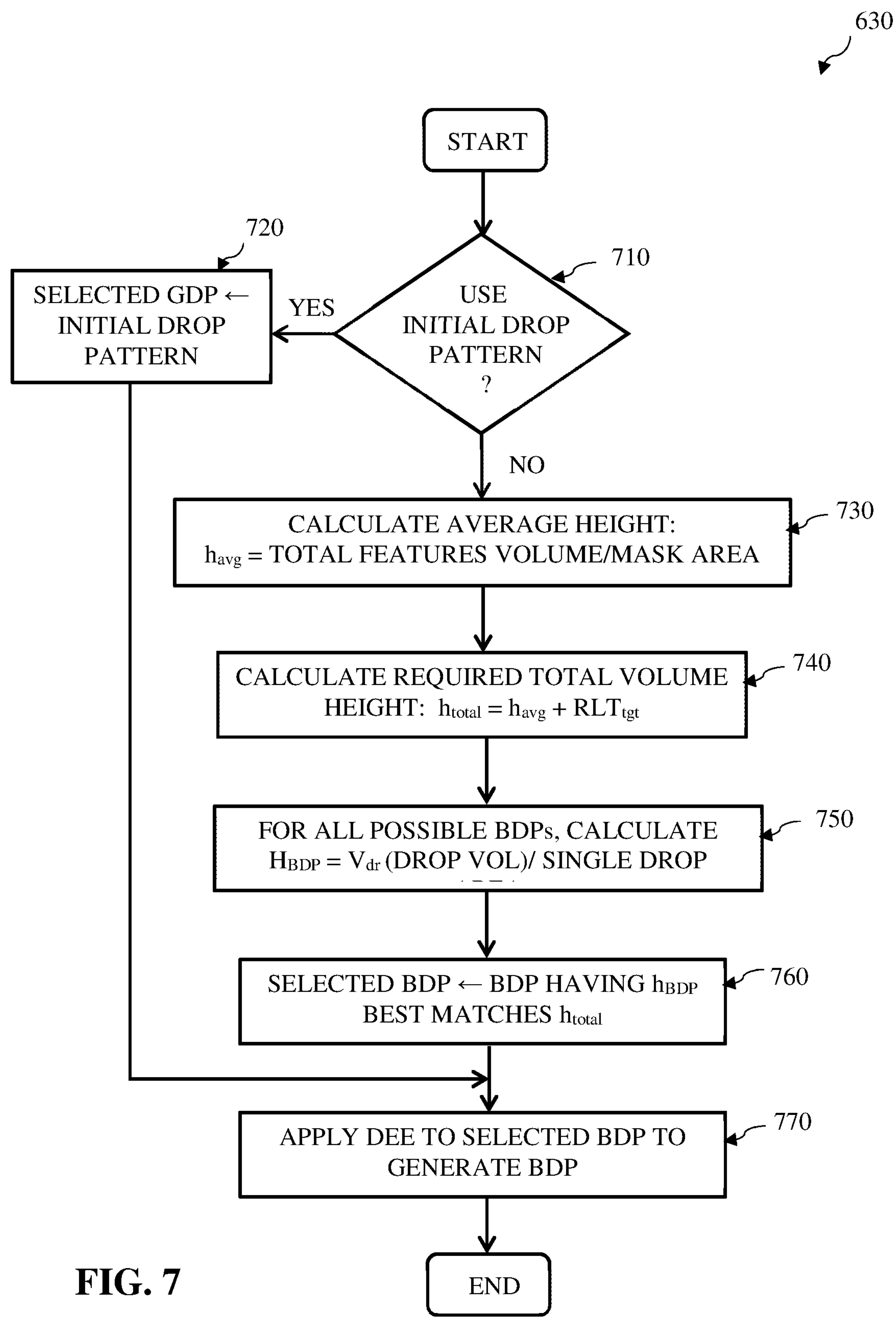
FIG. 7 is a diagram illustrating a process to generate a base grid drop pattern.

FIG. 7 is a diagram illustrating the process 630 shown in FIG. 6 to generate a base drop pattern (BDP). Upon START, the process 630 determine if an initial drop pattern is used (Block 710). If so, the process 630 goes to Block 720. Otherwise, the process 630 goes to block 730. In block 720, the process 630 selects the GDP as the default drop pattern. The process 630 then goes to block 770. In block 730, the process 630 calculates an average height $h_{avg}$ as follows:

$$h_{avg}=V_1/A_1 \quad (1)$$

where $V_1$ is the total features volume for the template and the substrate and $A_i$ is the template area. In an alternative embodiment, the template is divided into subregions each having different volume requirements. In this case, $h_{avg}$ is calculated for each subregion. $A_1$ is an area of a particular subregion, and $V_1$ is the total features volume for the subregion of the template and the substrate. In this case, the template $h_{avg}$ is the mean of $h_{avg}$ for all subregions.

Next, the process 630 calculates a required total volume height $h_{total}$ (Block 740) as follows:

$$h_{total}=h_{avg}+T_{tgt} \quad (2)$$

where $T_{tgt}$ is the target or desired RLT.

Then, for all possible BDPs, the process 630 calculates BDP height $h_{BDP}$ (Block 750) as follows:

$$h_{BDP}V_{dr}/A_2 \quad (3)$$

where $V_{dr}$ is the drop volume, $A_2$ is the single drop area. When the BDP is the GDP, the single drop area $A_2$ for a drop for a GDP may be determined by multiplying the minimum grid spacing in the two orthogonal directions (examples of minimum grid spacing are 5, 30, 35, micrometers) times a stride number n in each direction times a shape factor. The stride number n are positive integers (for example 1, 2, 3, 5, 10, etc.). The shape factor is a number that represents the type of grid for square grids the shape factor is 1 for diamond or staggered grids the shape factor is 2.

Next, the process 630 selects a BDP having a BDP height $h_{GDP}$ that best matches the required $h_{total}$ (Block 760) Then, the process 630 applies drop edge exclusion (DEE) to the selected BDP by cropping drops that fall inside the DEE region to generate the BDP (Block 770). The process 630 is then terminated.

Figure 8:
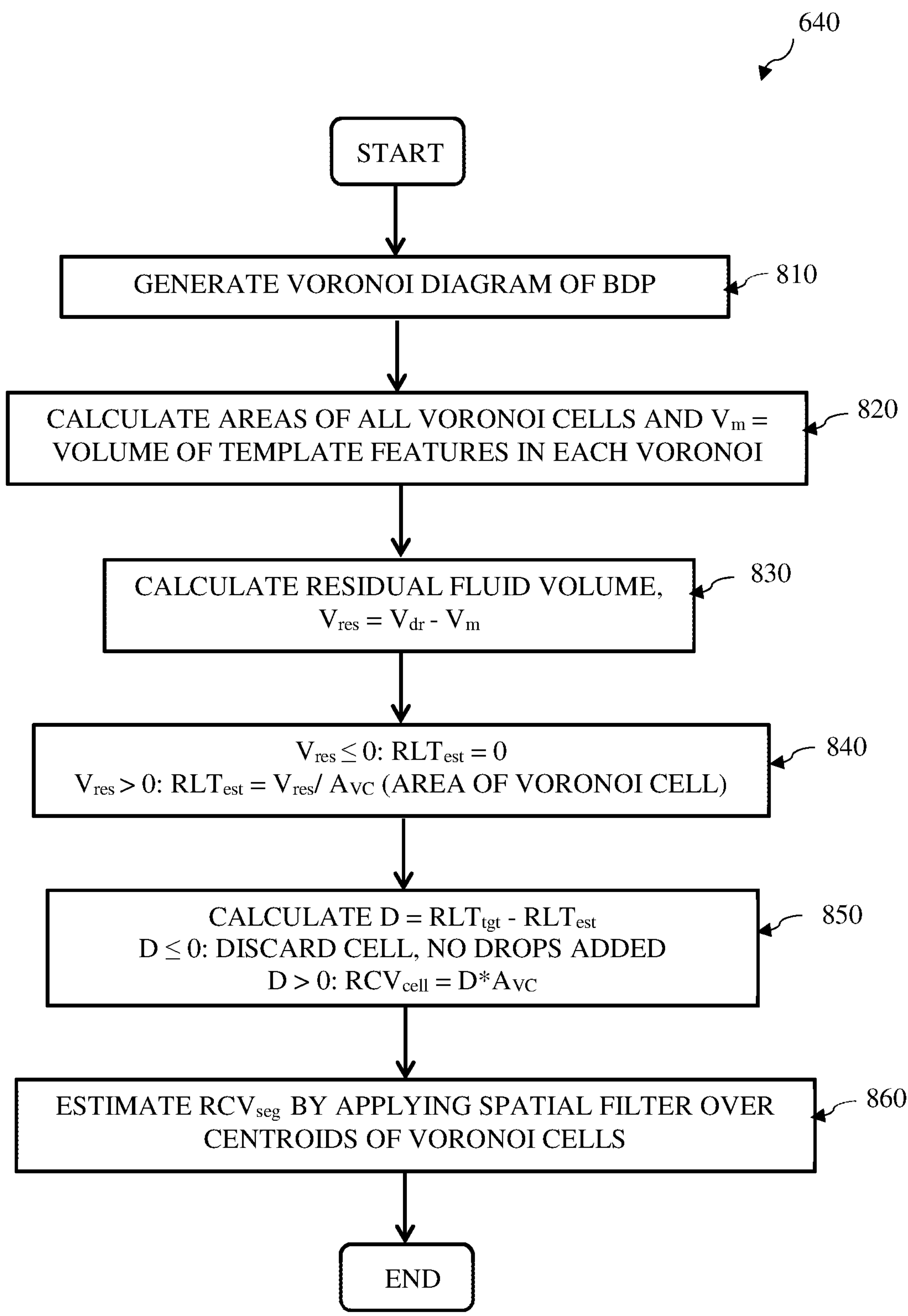
FIG. 8 is a diagram illustrating a process to estimate a segment required compensation volume (RCV).

FIG. 8 is a diagram illustrating the process 640 to estimate a segment required compensation volume (RCV).

Upon START, the process 640 generates a Voronoi diagram of the BDP to have N Voronoi cells where N is a positive integer equal to the number of drops in the BDP (Block 810). The seeds of each Voronoi cell coincide with center of each drop in the BDP. In an alternative embodiment, the droplets in BDP do not all have the same volume and a weighted Voronoi diagram that is weighted by the drop volume may be generated. In an alternative embodiment, the spread direction preference of each drop is used in determining the Voronoi cells. Next, the process 640 calculates a cell area of, and a feature volume $V_m$ in, each of the N Voronoi cells (Block 820). In an alternative embodiment, only Voronoi cells in the edge regions; adjacent the edge regions; and/or near (within 100-200 microns) the edge regions are calculated.

Then, the process 640 calculates a residual volume $V_{res}$ in each of the N Voronoi cells (Block 830) as follows:

$$V_{res}=V_{dr}-V_m \quad (4)$$

The residual volume $V_{res}$ represents the volume remaining or missing after all the features of the template have been filled. Next, the process 640 estimates a cell RLT based on the residual volume as follows. If $V_{res}\leq 0$, then $T_{est}$ is set to zero. Otherwise, Test is calculated as:

$$T_{est}=V_{res}/A_{VC} \quad (5)$$

where $A_{VC}$ is the area of the corresponding Voronoi cell. $T_{est}$ is an estimate for the imprint RLT in the Voronoi cell. The closeness of $T_{est}$ to $T_{tgt}$ is a measure of filling performance of the BDP.

Then, the process 640 estimates the segment RCV by applying a spatial filter over centroids of the N Voronoi cells to identify which centroids are part of each segment $RCV_{seg}$ (Block 860). The spatial filter is a window that has the same length, general shape, and position as each segment $RCV_{seg}$ and has a width that is 2-3 times the DEE near the segment. $RCV_{seg}$ is the sum of $V_{res}$ over the Voronoi cells that are inside the window of the spatial filter. The Segment area $A_{seg}$ may also be calculated as a sum of the Voronoi cell areas that are inside the spatial filter window, this will be approximately equal to the area of the spatial filter. The process 640 is then terminated.

Figure 9:
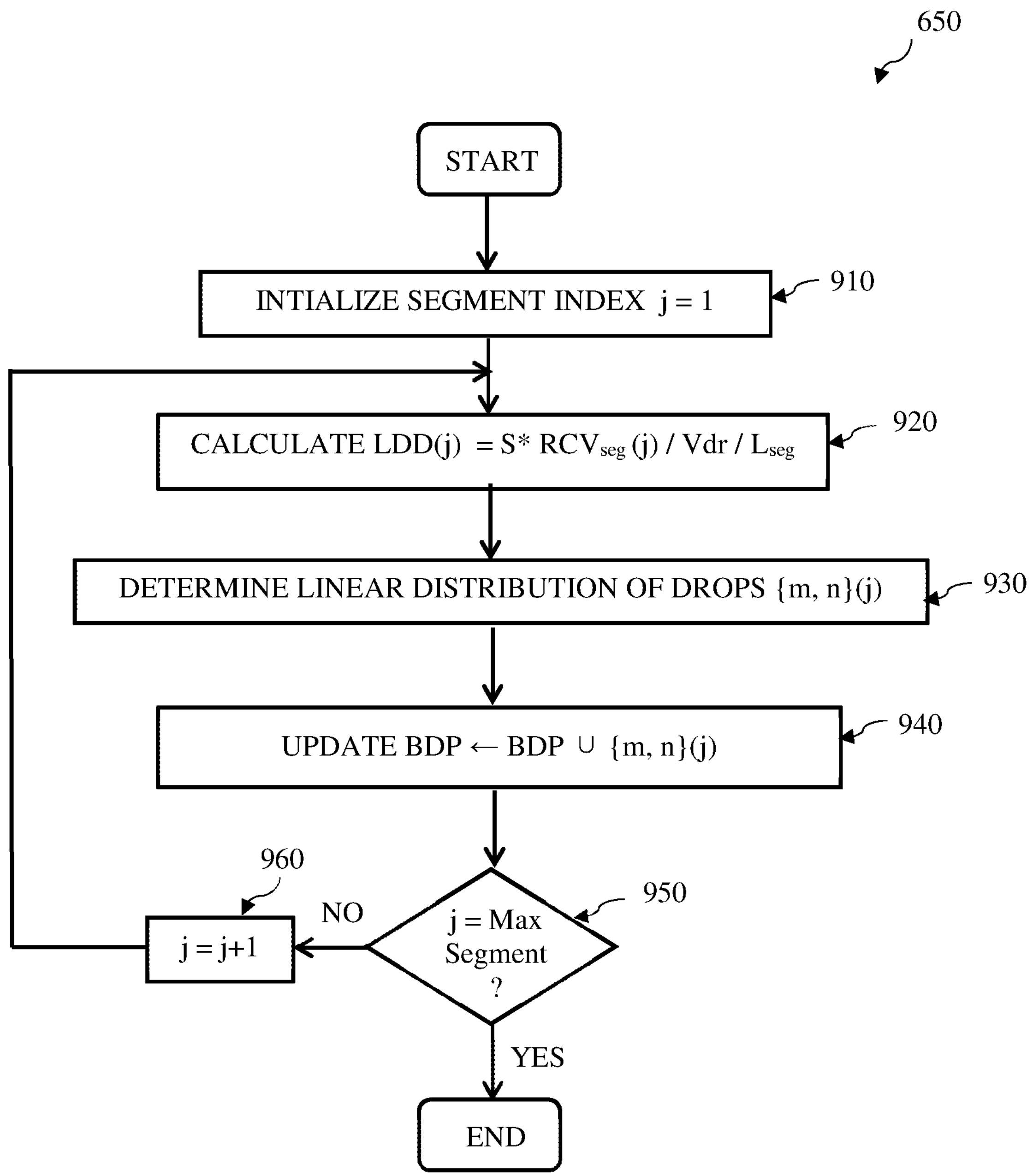
FIG. 9 is a diagram illustrating a process to generate edge drop arrangements.

FIG. 9 is a diagram illustrating the process 650 shown in FIG. 6 to generate edge drop arrangements.

Upon START, the process 650 initializes the segment index j=1 at the beginning of a loop (Block 910). Then, the process 650 calculates a linear drop density (LDD) using the compensation factor S, the segment RCV, and the drop volume (Block 920) as follows:

$$LDD(j)=S*RCV_{seg}(j)/V_{dr}/L_{seg} \quad (6)$$

where $RCV_{seg}$ (j) is the j-th segment RCV, $L_{seg}$ is the length of segment j along an edge segment interface j between the BDP and edge segment j, and S is the compensation factor. The segment $RCV_{seg}(j)$ is equal to the target RLT of the imprint field—the estimated thickness of segment j due to the initial drop pattern multiplied by the sum of the areas of the Voronoi cells of the segment. The j-th segment RCV $RCV_{seg}(j)$ may be calculated using equation (7) below:

$$RCV_{seg}(j)(T_{tgt}-T_{est}*(A_{seg}(j)) \quad (7)$$

As defined in equation (6) above LDD(j) is the number of compensation drops per unit length for segment j.

Next, the process 650 determines a linear distribution from the required LDD to obtain a drop number m for a stride number n of the GDP (Block 930). This may be done by searching for a suitable integer representing LDD because LDD as determined is a real number. To do so, the process 650 multiplies the LDD by a first integer from an increasing sequence of integers starting from 1 to produce a product. Then, the process 650 stops multiplying when the product is within for example about ten percent of a second integer. At time of stopping, the first integer is the stride number n and the second integer is the drop number m.

In particular, knowing LDD(j) for each segment j and the corresponding BDP period(j), we multiply LDD(j) by the integers n=1, 2, 3, . . . . until the product is close to an integer (m) (close is within 10% of an integer).

The integer m is the number of drops to be added for every n BDP periods of the segment.

After determining m and n, the set of all dispense locations in a test strip with a width of 1~2 minimum dispense pitches and a height equal to n times the BDP period is compiled. Multiple test drop arrangements are generated for the test strip having m drops placed at m dispense locations out of all test strip dispense locations (2*n*BDP period total locations) The typical test strip is small enough that all possible m-drop arrangements may be generated. The number of potential dispense locations could be for example on the order of 2*n*BDP and the number of test drop arrangements is equal to (2*n*BDP)Cm (choose m out of 2*n*BDP). Each of the multiple test drop arrangements may be tested against a criteria to measure their fitness which may be for example a test function of the distances between neighboring drops in each test drop arrangement and among drop arrangement drops and BDP drops. A chosen set of m drops is selected among the multiple test drop arrangements that best meets the criteria to measure the fitness for example has the lowest value for the test function.

This chosen set of m drops becomes the linear drop arrangement to be added to the BDP near segment j. The linear drop arrangement is repeated every n BDP periods in the segment j. An example of how equation (6) is used to determine n and m for various S values is illustrated in Table 1 below. The rows are exemplary RCV values and are in pL. The columns are S values. Each cell in the table is calculated for a segment that runs along the bottom edge of the template with a segment length of 26 mm ($L_{seg}$). Each cell in the table includes two values (m,n) Cells marked with an X indicate that the required volume/compensation factor combination is too low for any drops to be placed along the edge. In such cases, no drops are added and the base grid is left intact.

TABLE 1

| m, n values for RCV and S values | | | | | | | | |
|---|---|---|---|---|---|---|---|---|
| RCV \| S | 0.1 | 0.3 | 0.5 | 0.7 | 0.9 | 1.1 | 1.3 | 1.5 |
| 10 | X | X | 1.12 | 1.9 | 1.7 | 3.17 | 4.19 | 1.4 |
| 15 | X | 1.14 | 1.8 | 2.6 | 2.9 | 4.15 | 6.19 | 4.11 |
| 20 | X | 1.10 | 1.6 | 2.9 | 2.7 | 5.14 | 8.19 | 1.2 |
| 25 | X | 1.8 | 1.5 | 2.7 | 4.11 | 4.9 | 10.19 | 3.5 |
| 30 | X | 1.7 | 1.4 | 1.3 | 7.16 | 8.15 | 12.19 | 8.11 |
| 35 | 1.18 | 1.6 | 2.7 | 2.5 | 1.2 | 5.8 | 11.15 | 11.13 |
| 40 | 1.15 | 1.5 | 1.3 | 5.11 | 7.12 | 5.7 | 5.6 | 1.1 |
| 45 | 1.14 | 2.9 | 4.11 | 1.2 | 2.3 | 4.5 | 17.18 | 12.11 |
| 50 | 1.12 | 1.4 | 2.5 | 4.7 | 8.11 | 8.9 | 1.1 | 23.19 |

Then, the process 650 updates the base GDP using the linear distribution (Block 940). This may be done as follows. The process 650 generates a segment drop pattern based on the drop number m and the stride number n. Then, the process 650 incorporates the segment drop pattern into the base GDP.

Next, the process 650 determines if the segment index reaches the maximum value (Block 950). If not, the process 650 increments the segment index j and returns to Block 920. Otherwise, edge drop arrangements for each S value are generated.

Figure 10:
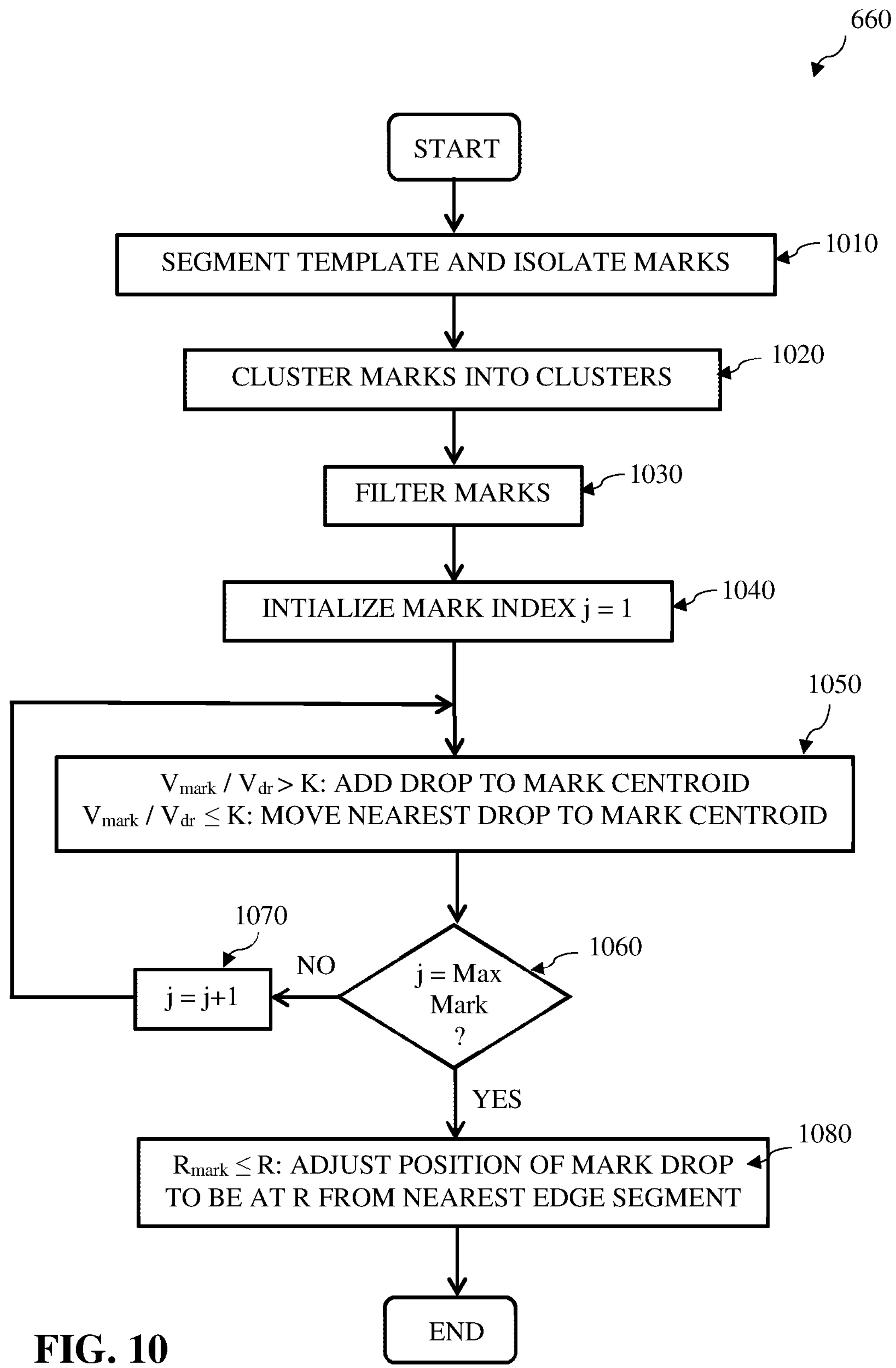
FIG. 10 is a diagram illustrating a process to generate edge drop arrangements.

FIG. 10 is a diagram illustrating the process 660 shown in FIG. 6 to generate the mark drop arrangement.

Upon START, the process 660 segments the template and isolates marks from the segmented template (Block 1010). Next, the process 660 clusters the marks into clusters (Block 1020). Then, the process 660 filters the marks (Block 1030). Field segmentation is the process by which the template features are classified into device features and marks. Marks tend to extend over small regions (5~50 microns) compared to device feature regions (>0.5 mm). Marks that are close to each other may be grouped into a large mark cluster. Close marks are marks that lie within a certain distance from each other with the distance being 1~2 times the largest dimension of the largest mark in the cluster. In an embodiment, marks are filtered such that all marks away from the template edge are discarded.

Next, the process 660 initializes the mark index j=1 to begin a loop (Block 1040). Then, the process 660 calculates a mark drop ratio $R_{mark}$ for each mark by dividing a mark fluid volume $V_{mark}$ by the drop volume $V_{dr}$ as follows:

$$R_{mark}=V_{mark}/V_{dr} \quad (8)$$

Next, the process 660 determines a mark drop based on the mark drop ratio and the mark factor K as follows. If the mark ratio is greater than the mark factor K, adding a drop to a mark centroid. Otherwise, the process 660 moves a nearest drop to a mark centroid (Block 1050).

Then, the process 660 determines if the mark index reaches the maximum value (Block 1060). If not, the process 660 increments the index (Block 1070) and returns to Block 1050. Otherwise, the loop is complete and the process 660 adjusts position of the mark drop using the distance factor R (Block 1080). This can be done by comparing the distance of the mark drop to R. If it is less than R from the nearest edge segment, it will be pushed onto the field to be at a distance R from the nearest edge segment. The process 660 is then terminated.

Figure 11:
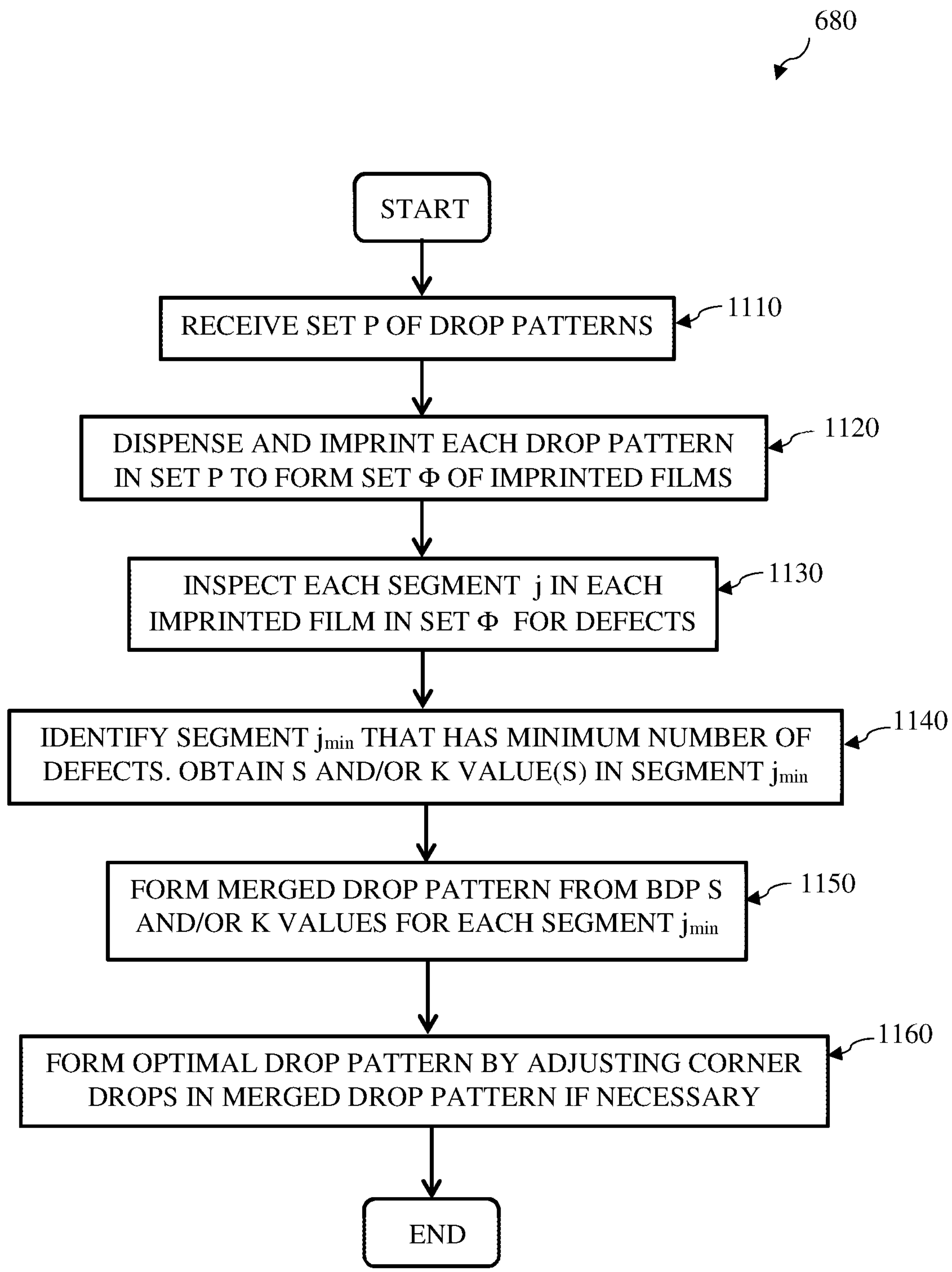
FIG. 11 is a diagram illustrating a process to generate an optimal drop pattern.

FIG. 11 is a diagram illustrating the process 680 shown in FIG. 6 to determine an optimal drop pattern.

Upon START, the process 680 receives a set P of drop patterns (Block 1110). This set of drop patterns may include a number of drop patterns that have been generated as shown in Block 670 (FIG. 6). Next, the process 680 dispenses and imprints each of the drop pattern in the set P to form a set Φ of imprinted films (Block 1120). Then, the process 680 inspects each segment j in each imprinted film in the set Φ for defects (Block 1130). The inspection may be done by an automatic image analysis method, a manual method, or a combination of automatic and manual methods.

Next, the process 680 identifies the segment $j_{min}$ that has a minimum number of defects among all the segments and obtains the S and/or K values in the segment $j_{min}$ (Block 1140). Then the process 680 forms a merged drop pattern from BDP, S values, and/or K values for each segment $j_{min}$ (Block 1150). Next, the process 680 forms the optimal drop pattern by adjusting corner drops im the merged drop pattern if necessary (Block 1160). The process 680 is then terminated.

Figure 12:
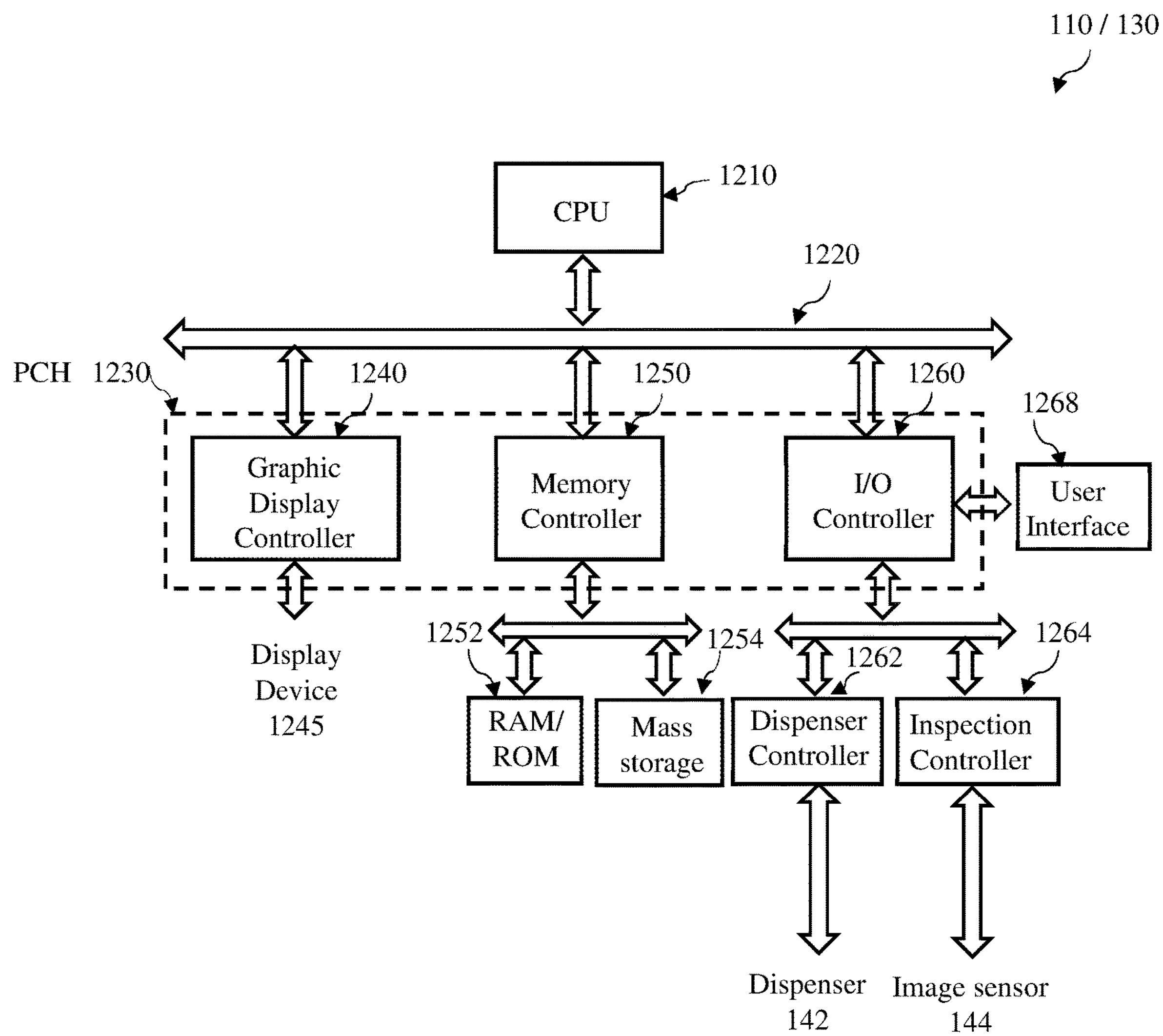
FIG. 12 is a diagram illustrating a processing system.

FIG. 12 is a diagram illustrating the processing system 110 or the control system 130 shown in FIG. 1.

The processing system 110 or the control system 130, referred to as the processing and/or control system 110/130, includes a central processing unit (CPU) or a processor 1210, a platform controller hub (PCH) 1230, and a bus 1220. The PCH 1230 may include a graphic display controller (GDC) 1240, a memory controller 1250, an input/output (I/O) controller 1260, and a mass storage controller 1254. The processing and control system 110/130 may include more or less than the above components. In addition, a component may be integrated into another component. As shown in FIG. 11, all the controllers 1240, 1250, and 1260 are integrated in the PCH 1230. The integration may be partial and/or overlapped. For example, the GDC 1240 may be integrated into the CPU 1210, the I/O controller 1260 and the memory controller 1250 may be integrated into one single controller, etc.

The CPU or processor 1210 is a programmable device that may execute a program or a collection of instructions to carry out a task. It may be a general-purpose processor, a digital signal processor, a microcontroller, or a specially designed processor such as one design from Applications Specific Integrated Circuit (ASIC). It may include a single core or multiple cores. Each core may have multi-way multi-threading. The CPU 1210 may have simultaneous multithreading feature to further exploit the parallelism due to multiple threads across the multiple cores. In addition, the CPU 1210 may have internal caches at multiple levels.

The bus 1220 may be any suitable bus connecting the CPU 1210 to other devices, including the PCH 1230. For example, the bus 1220 may be a Direct Media Interface (DMI).

The PCH 1230 in a highly integrated chipset that includes many functionalities to provide interface to several devices such as memory devices, input/output devices, storage devices, network devices, etc.

The I/O controller 1260 controls input devices (e.g., stylus, keyboard, and mouse, microphone, image sensor) and output devices (e.g., audio devices, speaker, scanner, printer). It also has interface to a user interface 1268 which provides interface to a user including specialized input/output devices and a network interface card which provides interface to a network and wireless controller (not shown).

The memory controller 1250 controls memory devices such as the random access memory (RAM) and/or the read-only memory (ROM) 1252, and other types of memory such as the cache memory and flash memory. The RAM 1252 may store instructions or programs, loaded from a mass storage device, that, when executed by the CPU 1210, cause the CPU 1210 to perform operations as described above. It may also store data used in the operations. The ROM 1252 may include instructions, programs, constants, or data that are maintained whether it is powered or not. The instructions or programs may correspond to the functionalities described above, such as the. drop patterns generator.

The GDC 1240 controls a display device 1245 and provides graphical operations. It may be integrated inside the CPU 1210. It typically has a graphical user interface (GUI) to allow interactions with a user who may send a command or activate a function. The GDC 1240 may display, on the display device, images of the color lights as collected from the sample in the human body.

The mass storage controller 1254 controls the mass storage devices such as CD-ROM and hard disk.

The I/O controller 1260 may include a dispenser controller 1262 and an inspection controller 1264. The dispenser controller 1262 may include switching circuits, drive circuits, or trim voltage generators to generate control voltages or currents to the actuators in the dispensers 142. The inspection controller 1264 performs control functions related to the inspection station and the image sensor 144, such as start and stop capturing images, etc.

Additional devices or bus interfaces may be available for interconnections and/or expansion. Some examples may include the Peripheral Component Interconnect Express (PCIe) bus, the Universal Serial Bus (USB), etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:

a wafer holder to hold one or more test wafers, each having an imprintable field; and a generator to generate a set of test drop patterns comprising:

a storage device storing a database that contains input parameters of a drop pattern generation (DPG) process for a template;

an input/output (I/O) interface circuit to interface with a user;

a processor; and a memory storing instructions that, when executed by the processor, cause the processor to perform operations comprising:

receiving a guide command from the user via the I/O interface circuit to guide the DPG process, retrieving at least one of the input parameters from the database prior to an inspection of imprinted fields for defects;

generating a base drop pattern (BDP) based on the at least one of the input parameters, estimating a segment required compensation volume (RCV) of edge segments near edges of the imprint field, generating edge drop arrangements at the edge segments based on the estimated segment RCV and the guide command, and generating a drop pattern based on the BDP and the edge drop arrangements as one of the drop patterns in the set prior to the inspection of imprinted fields for defects, wherein each drop pattern in the set has different edge arrangements, and wherein the set of drop patterns is deposited onto the one or more test wafers, the fields are imprinted, the imprinted fields are inspected, and an optimal drop pattern is determined based on the inspection of the imprinted fields for defects.

2. The apparatus according to claim 1, wherein the input parameters include at least one of a set of template attributes, a desired Residual Layer Thickness (RLT), a drop volume, and a set of wafer attributes;

wherein the guide command is one of a compensation factor S, a mark factor K, and a distance factor R.

3. The apparatus according to claim 2, wherein generating the BDP comprises:

calculating an average height;

calculating a required total volume height;

for all possible GDPs, calculating GDP height;

selecting a GDP having a GDP height best matching the required total volume height; and applying drop edge exclusion (DEE) to the selected GDP to generate the base GDP.

4. The apparatus according to claim 2, wherein estimating the segment RCV comprises:

generating a Voronoi diagram of the base GDP to have N Voronoi cells, N being a positive integer;

calculating a cell area of each of the N Voronoi cells;

calculating a feature volume in each of the N Voronoi cells;

calculating a residual volume in each of the N Voronoi cells;

estimating a cell RLT based on the residual volume; and estimating the segment RCV by applying a spatial filter over centroids of the N Voronoi cells.

5. The apparatus according to claim 2, wherein generating the edge drop arrangements comprises:

calculating a linear drop density (LDD) using the compensation factor S, the segment RCV, and the drop volume;

computing a number of drops to be placed along the segment to satisfy the segment RCV and determining locations of the drops according to a criterion that is based on a distance between the drops to be placed and the drops in the BDP; and updating the base GDP using the linear distribution.

6. The apparatus according to claim 5, wherein the operations further comprise generating a mark drop arrangement different from the drop pattern at a segment where a mark is formed, generating the mark drop arrangement comprising:

segmenting the template and isolating marks from the segmented template;

clustering the isolated marks into clusters;

filtering the clustered marks;

calculating a mark drop ratio for each mark by dividing a mark fluid volume by the drop volume;

determining a mark drop based on the mark drop ratio and the mark factor K; and adjusting position of the mark drop using the distance factor R.

7. The apparatus according to claim 5, wherein calculating the required LDD comprises:

dividing a product of the segment RCV and the compensation factor S by the drop volume to produce an intermediate result; and dividing the intermediate result by a segment length to produce the required LDD.

8. The apparatus according to claim 5, wherein determining the linear distribution comprises:

multiplying the LDD by a first integer from an increasing sequence of integers starting from 1 to produce a product; and stopping multiplying when the product is within ten percent of a second integer, wherein at time of stopping, the first integer is the stride number n and the second integer is the drop number m.

9. The apparatus according to claim 8, wherein updating the base GDP using the linear distribution comprises:

generating a segment drop pattern based on the drop number m and the stride number n; and incorporating the segment drop pattern into the base GDP.

10. The apparatus according to claim 6, wherein determining the mark drop comprises:

if the mark ratio is greater than the mark factor K, adding a drop to a mark centroid; and else moving a nearest drop to a mark centroid.

11. A method comprising:

generating a set of test drop patterns for a plurality of imprintable fields comprising:

receiving a guide command from a user via an input/output (I/O) interface circuit to guide the DPG process, retrieving at least one of input parameters from a database in a storage device prior to an inspection of imprinted fields for defects;

generating a base drop pattern (BDP) based on the at least one of the input parameters, estimating a segment required compensation volume (RCV) of edge segments near edges of the imprint field, generating edge drop arrangements at the edge segments based on the estimated segment RCV and the guide command, and generating a drop pattern based on the BDP and the edge drop arrangements as one of the drop patterns in the set prior to the inspection of imprinted fields for defects, wherein each drop pattern in the set has different edge arrangements;

depositing the set of drop patterns onto fields in one or more test wafers;

imprinting the fields;

inspecting the imprinted fields; and determining an optimal drop pattern having least defects.

12. The method according to claim 11, wherein the input parameters include at least one of a set of mask attributes, a desired Residual Layer Thickness (RLT), a drop volume, and a set of wafer attributes;

wherein the guide command is one of a compensation factor S, a mark factor K, and a distance factor R.

13. The method according to claim 12, wherein generating the base GDP comprises:

calculating an average height;

calculating a required total volume height;

for all possible GDPs, calculating GDP height;

selecting a GDP having a GDP height best matched the required total volume height; and applying drop edge exclusion (DEE) to the selected GDP to generate the base GDP.

14. The method according to claim 12, wherein estimating the segment RCV comprises:

generating a Voronoi diagram of the base GDP to have N Voronoi cells, N being a positive integer;

calculating a cell area of each of the N Voronoi cells;
calculating a feature volume in each of the N Voronoi cells;
calculating a residual volume in each of the N Voronoi cells;
estimating a cell RLT based on the residual volume; and
estimating the segment RCV by applying a spatial filter over centroids of the N Voronoi cells.

15. The method according to claim 12, wherein generating the edge drop arrangements comprises:
calculating a linear drop density (LDD) using the compensation factor S, the segment RCV, and the drop volume;
computing a number of drops to be placed along the segment to satisfy the segment RCV and determining locations of the drops according to a criterion that is based on a distance between the drops to be placed and the drops in the BDP; and
updating the base GDP using the linear distribution.

16. The method according to claim 15, further comprising generating a mark drop arrangement different from the drop pattern at a segment where a mark is formed, wherein generating the mark drop arrangement comprises:
segmenting the template and isolating marks from the segmented template;
clustering the isolated marks into clusters;
filtering the clustered marks;
calculating a mark drop ratio for each mark by dividing a mark fluid volume by the drop volume;
determining a mark drop based on the mark drop ratio and the mark factor K; and
adjusting position of the mark drop using the distance factor R.

17. The method according to claim 15, wherein calculating the required LDD comprises:
dividing a product of the segment RCV and the compensation factor S by the drop volume to produce an intermediate result; and
dividing the intermediate result by a segment length to produce the required LDD.

18. The method according to claim 15, wherein determining the linear distribution comprises:
multiplying the LDD by a first integer from an increasing sequence of integers starting from 1 to produce a product; and
stopping multiplying when the product is within ten percent of a second integer,
wherein at time of stopping, the first integer is the stride number n and the second integer is the drop number m.

19. The method according to claim 18, wherein updating the base GDP using the linear distribution comprises:
generating a segment drop pattern based on the drop number m and the stride number n; and
incorporating the segment drop pattern into the base GDP.

20. The method according to claim 16, wherein determining the mark drop comprises:
if the mark ratio is greater than the mark factor K, adding a drop to a mark centroid; and
else moving a nearest drop to a mark centroid.

21. A system comprising:
an inspection station to inspect imprinted fields for defects; and
an apparatus comprising:
a wafer holder to hold one or more test wafers, each having an imprintable field; and
a generator to generate a set of test drop patterns comprising:
a storage device storing a database that contains input parameters of a drop pattern generation (DPG) process for a mask;
an input/output (I/O) interface circuit to interface with a user;
a processor; and
a memory storing instructions that, when executed by the processor, cause the processor to perform operations comprising:
receiving a guide command from the user via the I/O interface circuit to guide the DPG process,
retrieving at least one of the input parameters from the database prior to an inspection of imprinted fields for defects,
generating a base drop pattern (BDP) based on at least one of the input parameters,
estimating a segment required compensation volume (RCV) of edge segments near edges of the imprint field,
generating edge drop arrangements at the edge segments based on the estimated segment RCV and the guide command, and
generating a drop pattern based on the BDP and the edge drop arrangements as one of the drop patterns in the set prior to the inspection of imprinted fields for defects, wherein each drop pattern in the set has different edge arrangements,
wherein the set of drop patterns is deposited onto the one or more test wafers for the inspection station to determine an optimal drop pattern based on the inspection of imprinted fields for defects.

22. The system according to claim 21,
wherein the input parameters include at least one of a set of mask attributes, a desired Residual Layer Thickness (RLT), a drop volume, and a set of wafer attributes;
wherein the guide command is one of a compensation factor S, a mark factor K, and a distance factor R.

23. The system according to claim 22, wherein generating the BDP comprises:
calculating an average height;
calculating a required total volume height;
for all possible GDPs, calculating GDP height;
selecting a GDP having a GDP height best matching the required total volume height; and
applying drop edge exclusion (DEE) to the selected GDP to generate the base GDP.

24. The system according to claim 22, wherein estimating the segment RCV comprises:
generating a Voronoi diagram of the base GDP to have N Voronoi cells, N being a positive integer;
calculating a cell area of each of the N Voronoi cells;
calculating a feature volume in each of the N Voronoi cells;
calculating a residual volume in each of the N Voronoi cells;
estimating a cell RLT based on the residual volume; and
estimating the segment RCV by applying a spatial filter over centroids of the N Voronoi cells.

25. The system according to claim 22, wherein generating the edge drop arrangements comprises:
calculating a linear drop density (LDD) using the compensation factor S, the segment RCV, and the drop volume;
computing a number of drops to be placed along the segment to satisfy the segment RCV and determining locations of the drops according to a criterion that is based on a distance between the drops to be placed and the drops in the BDP; and updating the base GDP using the linear distribution.

26. The system according to claim 25, wherein the operations further comprise generating a mark drop arrangement different from the drop pattern at a segment where a mark is formed, generating the mark drop arrangement comprising:

segmenting the template and isolating marks from the segmented template;

clustering the isolated marks into clusters;

filtering the clustered marks;

calculating a mark drop ratio for each mark by dividing a mark fluid volume by the drop volume;

determining a mark drop based on the mark drop ratio and the mark factor K; and adjusting position of the mark drop using the distance factor R.

* * * * *